(12) United States Patent  
Kim et al.

(10) Patent No.: US 8,598,598 B2  
(45) Date of Patent: Dec. 3, 2013

(54) LIGHT EMITTING DEVICE HAVING VERTICALLY STACKED LIGHT EMITTING DIODES

(75) Inventors: Sung Han Kim, Suwon-si (KR); Kyoung Hoon Kim, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 464 days.

(21) Appl. No.: 12/775,008

(22) Filed: May 6, 2010

(65) Prior Publication Data

US 2010/0219426 A1    Sep. 2, 2010

Related U.S. Application Data

(62) Division of application No. 12/064,228, filed as application No. PCT/KR2006/003844 on Sep. 27, 2006, now Pat. No. 8,089,074.

(30) Foreign Application Priority Data

Sep. 30, 2005  (KR) .............................. 2005-0091998  
Oct. 31, 2005  (KR) .............................. 2005-0103201

(51) Int. Cl.  
*H01L 27/15*    (2006.01)

(52) U.S. Cl.  
USPC ..................... 257/79; 257/E27.12; 438/26

(58) Field of Classification Search  
USPC .................... 438/26; 257/E27.12, 79  
See application file for complete search history.

(56) References Cited

U.S. PATENT DOCUMENTS

| 4,318,059 A | 3/1982 | Lang et al. |
| 5,187,116 A | 2/1993 | Kitagawa et al. |

(Continued)

FOREIGN PATENT DOCUMENTS

| EP | 1 553 641 | 7/2005 |
| GB | 2 234 393 | 1/1991 |

(Continued)

OTHER PUBLICATIONS

Notice of Allowance dated Oct. 26, 2011 for U.S. Appl. No. 12/064,228.

(Continued)

*Primary Examiner* — Allen Parker  
(74) *Attorney, Agent, or Firm* — H.C. Park & Associates, PLC (57) ABSTRACT

Disclosed is a light emitting device having vertically stacked light emitting diodes. It comprises a lower semiconductor layer of a first conductive type positioned on a substrate, a semiconductor layer of a second conductive type on the lower semiconductor layer of a first conductive type, and an upper semiconductor layer of a first conductive type on the semiconductor layer of a second conductive type. Furthermore, a lower active layer is interposed between the lower semiconductor layer of a first conductive type and the semiconductor layer of a second conductive type, and an upper active layer is interposed between the semiconductor layer of a second conductive type and the upper semiconductor layer of a first conductive type. Accordingly, there is provided a light emitting device having a structure in which a lower light emitting diode comprising the lower active layer and an upper light emitting diode comprising the upper active layer are vertically stacked. Therefore, light output per unit area of the light emitting device is enhanced as compared with a conventional light emitting device, and thus, a chip area of the light emitting device needed to obtain the same light output as the conventional light emitting device can be reduced.

11 Claims, 9 Drawing Sheets

(56) References Cited

U.S. PATENT DOCUMENTS

| | | |
|---|---|---|
| 5,684,309 A | 11/1997 | McIntosh et al. |
| 5,696,389 A | 12/1997 | Ishikawa et al. |
| 5,703,436 A | 12/1997 | Forrest et al. |
| 5,739,552 A | 4/1998 | Kimura et al. |
| 5,757,026 A | 5/1998 | Forrest et al. |
| 6,100,103 A | 8/2000 | Shim et al. |
| 6,380,564 B1 * | 4/2002 | Chen et al. .............. 257/99 |
| 2001/0030318 A1 | 10/2001 | Nakamura et al. |
| 2002/0041148 A1 | 4/2002 | Coh et al. |
| 2003/0047742 A1 | 3/2003 | Hen |
| 2003/0160251 A1 | 8/2003 | Wanlass et al. |
| 2006/0012997 A1 | 1/2006 | Catalano et al. |
| 2006/0256826 A1 | 11/2006 | Lin et al. |

FOREIGN PATENT DOCUMENTS

| | | |
|---|---|---|
| JP | 11-016683 | 1/1999 |
| JP | 11-233827 | 8/1999 |
| JP | 11-251687 | 9/1999 |
| JP | 2000-183325 | 6/2000 |
| JP | 2002-043624 | 2/2002 |
| JP | 2004-006582 | 8/2004 |
| JP | 2005-019874 | 1/2005 |
| JP | 07-183576 | 7/2005 |
| KR | 2001-0110916 | 12/2001 |
| KR | 2002-0021247 | 3/2002 |
| KR | 2004-0040900 | 5/2004 |
| KR | 2005-0031015 | 4/2005 |
| WO | 2004023568 | 3/2004 |
| WO | 2005/073485 | 8/2005 |

OTHER PUBLICATIONS

Non-Final Office Action of Apr. 13, 2011 in U.S. Appl. No. 12/064,228.

Y.K. Su, S. J. Chang, Chih-Hsin Ko, J.F. Chen, Ta-Ming Kuan, Wen How Lan, Wen-Jen Lin, Ya-Tun Cherng, Jim Webb, "InGaN/GaN Light Emitting Diodes with a p-Down Structure", IEEE Transactions on Electron Devices, Aug. 2002, pp. 1361-1366, vol. 49, No. 8.

Chinese Office Action issued on Sep. 25, 2009.

T. Fujii et al., "Increase in the extraction efficiency of GaN-based light-emitting diodes via surface roughening", Applied Physics Letters, vol. 84, No. 6, Feb. 9, 2004, pp. 855-857.

Final Office Action of U.S. Appl. No. 12/064,228 issued on Oct. 27, 2010.

Extended European Search Report of Jan. 26, 2011 in corresponding European Patent Application No. 06 798 927.7.

Non-Final Office Action issued on Oct. 22, 2013 in U.S. Appl. No. 14/021,437.

* cited by examiner

LIGHT EMITTING DEVICE HAVING VERTICALLY STACKED LIGHT EMITTING DIODES

CROSS REFERENCE TO RELATED APPLICATIONS

This application is a divisional of U.S. patent application Ser. No. 12/064,228 filed Feb. 19, 2008 which is the National Stage Entry of International Application No. PCT/KR2006/003844 filed Sep. 27, 2006 and claims priority from Korean Patent Application No. 2005-0103201 filed Oct. 31, 2005 and Korean Patent Application No. 2005-0091998 filed Sep. 30, 2005, which are hereby incorporated by reference for all purposes as if fully set forth herein.

TECHNICAL FIELD

The present invention relates a light emitting device, and more particularly, to a light emitting device having vertically stacked light emitting diodes.

BACKGROUND ART

GaN-based light emitting diodes (LEDs) have been applied and developed for about 10 years. The GaN-based LEDs have significantly advance the LED technologies and has been employed in various applications including full color LED displays, LED traffic signals, white LEDs and the like.

Recently, high-efficiency white LEDs have been expected to replace fluorescent lamps. In particular, the efficiency of white LEDs is approaching that of ordinary fluorescent lamps.

Two major approaches to improve the efficiency of LEDs have been attempted. The first approach is to enhance the internal quantum efficiency determined by the crystal quality and the epitaxial layer structure, and the second approach is to increase the light extraction efficiency.

Since the internal quantum efficiency currently reaches 70~80%, there is little room for further improvement of the internal quantum efficiency. However, the light extraction efficiency may be further improved. In the light extraction efficiency, it is most important to eliminate internal loss of light due to total internal reflection.

A light emitting diode with improved light extraction efficiency through the prevention of total internal reflection has been disclosed in Applied Physics Letters, Vol. 84, No. 6, pp. 855-857, entitled "Increase in the extraction efficiency of GaN-Based light emitting diodes via surface roughening" by Fujii et al.

The LED is formed by depositing an N-type semiconductor layer, an active layer and a P-type semiconductor layer on a sapphire substrate, bonding the semiconductor layers on a submount, separating the semiconductor layers from the substrate using a laser lift-off (LLO) technique, and then roughening a surface of the N-type semiconductor layer. As the surface of the N-type semiconductor layer is roughened, the extraction efficiency of light emitted to the outside through the N-type semiconductor layer can be improved.

However, since there is a limitation in improvement of the light extraction efficiency, a chip area should be increased in order to obtain necessary light output per unit chip. The increase in the chip area results in the increase in manufacturing costs per chip. Accordingly, a new LED capable of increasing light output from the same unit chip area is required.

Meanwhile, an LED is repeatedly turned on/off according to the direction of a current from an AC power supply. Thus, in a case where the LED is used while connecting directly to the AC power supply, there is a problem in that the LED does not continuously emit light and may be easily damaged due to reverse current.

To solve such a problem of the light emitting diode, a light emitting diode that can be used while connected directly to a high-voltage AC power supply has been disclosed in PCT Publication No. WO 2004/023568 A1 entitled "Light-Emitting Device Having Light-Emitting Elements" by Sakai et al.

According to PCT Publication No. WO 2004/023568 A1, light emitting diodes (light emitting cells) are two-dimensionally connected in series on an insulating substrate such as a sapphire substrate to form LED arrays. Two LED arrays are connected in reverse parallel on the sapphire substrate. As a result, a single chip light emitting device that can be driven by means of an AC power supply is provided.

In such a light emitting device, since LED arrays are alternately operated under an AC power supply, its light output is considerably limited as compared with a case where light emitting cells are simultaneously operated. Thus, it is further necessary to improve the light output per unit area within such a light emitting device.

DISCLOSURE OF INVENTION

Technical Problem

An object of the present invention is to provide a light emitting device capable of increasing light output per unit area.

Other object of the present invention is to provide a light emitting device with improved light output which can be driven under an AC power supply.

Technical Solution

To achieve the aforementioned objects of the present invention, the present invention provides a light emitting device having vertically stacked light emitting diodes. A light emitting device according to an aspect of the present invention comprises a lower semiconductor layer of a first conductive type positioned on a substrate. A lower semiconductor layer of a second conductive type is positioned on the lower semiconductor layer of a first conductive type, and a upper semiconductor layer of a second conductive type is positioned on the lower semiconductor layer of a second conductive type. Further, an upper semiconductor layer of a first conductive type is positioned on the upper semiconductor layer of a second conductive type. Furthermore, a lower active layer is interposed between the lower semiconductor layer of a first conductive type and the lower semiconductor layer of a second conductive type, and an upper active layer is interposed between the upper semiconductor layer of a second conductive type and the upper semiconductor layer of a first conductive type. In addition, a separating layer is interposed between the lower semiconductor layer of a second conductive type and the upper semiconductor layer of a second conductive type. Accordingly, there is provided a light emitting device having a structure in which a lower light emitting diode comprising the lower semiconductor layer of a first conductive type, the lower active layer and the lower semiconductor layer of a second conductive type and an upper light emitting diode comprising the upper semiconductor layer of a second conductive type, the upper active layer and the upper semiconductor layer of a first conductive type are separated by the separating layer.

Here, the separating layer is a layer for electrically separating the lower and upper light emitting diodes, and may be, for example, an insulating layer or high-resistance semi-insulating layer. Further, the first and second conductive types indicate N-type and P-type, or P-type and N-type, respectively.

Meanwhile, first cladding layers may be arranged such that the lower active layer is interposed between the first cladding layers, and second cladding layers may be arranged such that the upper active layer is interposed between the second cladding layers.

The lower semiconductor layer of a second conductive type may be positioned on one region of the lower semiconductor layer of a first conductive type, the upper semiconductor layer of a second conductive type may be positioned on one region of the lower semiconductor layer of a second conductive type, and the upper semiconductor layer of a first conductive type may be positioned on one region of the upper semiconductor layer of a second conductive type. At this time, a first-type lower electrode may be formed on other region of the lower semiconductor layer of a first conductive type, and a second-type lower electrode may be formed on other region of the lower semiconductor layer of a second conductive type. Further, a second-type upper electrode may be formed on other region of the upper semiconductor layer of a second conductive type, and a first-type upper electrode may be formed on the upper semiconductor layer of a first conductive type. The second-type lower and upper electrodes are connected to one terminal of an external power supply and the first-type lower and upper electrodes are connected to the other terminal thereof, so that the light emitting device can be driven. Further, two external power supplies are connected to the first-type and second-type lower electrodes and the second-type and first-type upper electrodes, respectively, so that the upper and lower light emitting diodes can be individually driven.

Meanwhile, a codoped layer may be interposed between the lower semiconductor layer of a first conductive type and the lower active layer or between the upper semiconductor layer of a second conductive type and the upper active layer.

A light emitting device according to the aspect of the present invention may comprise a plurality of light emitting cells positioned on a substrate. Each of the light emitting cells comprises a lower semiconductor layer of a first conductive type positioned on the substrate. A lower semiconductor layer of a second conductive type is positioned on one region of the lower semiconductor layer of a first conductive type, and an upper semiconductor layer of a second conductive type is positioned on one region of the lower semiconductor layer of a second conductive type. Further, an upper semiconductor layer of a first conductive type is positioned on one region of the upper semiconductor layer of a second conductive type. Furthermore, a lower active layer is interposed between the lower semiconductor layer of a first conductive type and the lower semiconductor layer of a second conductive type, and an upper active layer is interposed between the upper semiconductor layer of a second conductive type and the upper semiconductor layer of a first conductive type. In addition, a separating layer is interposed between the lower semiconductor layer of a second conductive type and the upper semiconductor layer of a second conductive type. Accordingly, there is provided a plurality of light emitting cells each having vertically stacked lower and upper light emitting diodes, wherein the lower light emitting diode comprises the lower semiconductor layer of a first conductive type, the lower active layer and the lower semiconductor layer of a second conductive type and the upper light emitting diode comprises the upper semiconductor layer of a second conductive type, the upper active layer and the upper semiconductor layer of a first conductive type.

Each of the light emitting cells may have first cladding layers between which the lower active layer is interposed and second cladding layers between which the upper active layer is interposed.

Meanwhile, each of the light emitting cells may further comprise a first-type lower electrode formed on other region of the lower semiconductor layer of a first conductive type. Further, a second-type lower electrode may be formed on other region of the lower semiconductor layer of a second conductive type, a second-type upper electrode may be formed on other region of the upper semiconductor layer of a second conductive type, and a first-type upper electrode may be formed on the upper semiconductor layer of a first conductive type. The first-type lower and upper electrodes of each light emitting cell may be electrically connected to the second-type lower and upper electrodes of an adjacent light emitting cell, respectively, to provide an array of light emitting cells connected in series. According to this embodiment, there can be provided an upper array in which the upper light emitting diodes are connected in series with one another and a lower array in which the lower light emitting diodes are connected in series with one another.

In the meantime, in each of the light emitting cells, a codoped layer may be interposed between the lower semiconductor layer of a first conductive type and the lower active layer or between the lower semiconductor layer of a second conductive type and the upper active layer.

A light emitting device according to another aspect of the present invention comprises a lower semiconductor layer of a first conductive type positioned on a substrate. A semiconductor layer of a second conductive type is positioned on the lower semiconductor layer of a first conductive type, and an upper semiconductor layer of a first conductive type is positioned on the semiconductor layer of a second conductive type. Furthermore, a lower active layer is interposed between the lower semiconductor layer of a first conductive type and the semiconductor layer of a second conductive type, and an upper active layer is interposed between the semiconductor layer of a second conductive type and the upper semiconductor layer of a first conductive type. Accordingly, there is provided a light emitting device in which a lower light emitting diode comprising the lower semiconductor layer of a first conductive type, the lower active layer and the semiconductor layer of a second conductive type and an upper light emitting diode comprising the semiconductor layer of a second conductive type, the upper active layer and the upper semiconductor layer of a first conductive type are vertically stacked. Thus, light output per unit area of the light emitting device is increased as compared with a conventional light emitting device. Further, when the lower and upper active layers are formed of different materials, a light emitting device capable of emitting light with various wavelengths can be provided.

Meanwhile, first cladding layers may be arranged such that the lower active layer is interposed between the first cladding layers, and second cladding layers may be arranged such that the upper active layer is interposed between the second cladding layers.

In the meantime, the semiconductor layer of a second conductive type may be positioned on one region of the lower semiconductor layer of a first conductive type, and the upper semiconductor layer of a first conductive type may be positioned on one region of the semiconductor layer of a second conductive type. At this time, a first-type lower electrode may be formed on other region of the lower semiconductor layer of a first conductive type, a second-type electrode may be formed on other region of the semiconductor layer of a second conductive type, and a first-type upper electrode may be formed on the upper semiconductor layer of a first conductive type. Thus, the second-type electrode is connected to one terminal of an external power supply and the first lower and upper electrodes are connected to the other terminal thereof, so that the light emitting device can be driven through a single external power supply. Further, the lower and upper light emitting diodes of the light emitting device may be individually driven using two external power supplies.

Furthermore, a codoped layer may be interposed between the lower semiconductor layer of a first conductive type and the lower active layer or between the semiconductor layer of a second conductive type and the upper active layer. The codoped layer is a semiconductor layer doped together with N-type and P-type ions, and may be, for example, GaN doped together with Mg and Si or with Mg and In. Particularly, the codoped layer is formed on a P-type semiconductor layer to enhance the crystal quality of an active layer formed thereon.

A light emitting device according to the another aspect of the present invention may comprise a plurality of light emitting cells positioned on a substrate. Each of the light emitting cells comprises a lower semiconductor layer of a first conductive type positioned on the substrate. A semiconductor layer of a second conductive type is positioned on one region of the semiconductor layer of a second conductive type, and an upper semiconductor layer of a first conductive type is positioned on one region of the semiconductor layer of a second conductive type. Furthermore, a lower active layer is interposed between the lower semiconductor layer of a first conductive type and the semiconductor layer of a second conductive type, and an upper active layer is interposed between the semiconductor layer of a second conductive type and the upper semiconductor layer of a first conductive type. Accordingly, there is provided a plurality of light emitting cells each having vertically stacked lower and upper light emitting diodes, wherein the lower light emitting diode comprises the lower semiconductor layer of a first conductive type, the lower active layer and the semiconductor layer of a second conductive type, and the upper light emitting diode comprises the semiconductor layer of a second conductive type, the upper active layer and the upper semiconductor layer of a first conductive type. Thus, there can be provided a light emitting device in which the light emitting cells are electrically connected to allow the device to be driven under an AC power supply, and light output per a unit area of the light emitting device is increased as compared with a conventional light emitting device. Further, when the lower and upper active layers are formed of different materials, a light emitting device in which the lower and upper light emitting diodes emit light with different wavelengths can be provided.

Each of the light emitting cells may have first cladding layers between which the lower active layer is interposed and second cladding layers between which the upper active layer is interposed.

Meanwhile, each of the light emitting cells may further comprise a first-type lower electrode formed on other region of the lower semiconductor layer of a first conductive type. Further, a second-type electrode may be formed on other region of the semiconductor layer of a second conductive type and a first-type upper electrode may be formed on the upper semiconductor layer of a first conductive type. The first-type lower and upper electrodes of each light emitting cell may be electrically connected to the second-type electrode of an adjacent light emitting cell. Thus, the second-type electrode of each light emitting cell is electrically connected to the first-type lower and upper electrodes of another adjacent light emitting cell. Accordingly, there is provided an array in which the light emitting cells are connected in series with each other.

In some embodiments of the present invention, other second-type electrode may be formed on another region of the semiconductor layer of a second conductive type, in addition to the first-type lower electrode, the second-type electrode and the first-type upper electrode. The first-type lower electrode of each light emitting cell is connected to the second-type electrode of an adjacent light emitting cell, and the other second-type electrode of each light emitting cell is connected to the first-type upper electrode of the adjacent light emitting cell. Further, the second electrode of each light emitting cell is connected to the first-type lower electrode of other adjacent emitting cell, and the first-type upper electrode of each light emitting cell is connected to the other second electrode of the other adjacent light emitting cell. According to these embodiments, there can be provided an array in which the upper light emitting diodes of the light emitting cells are connected in series and an array in which the lower light emitting diodes of the light emitting cells are connected in series, and the two arrays are then connected in reverse parallel to each other. Further, nodes between the light emitting diodes in one array are connected to nodes between the light emitting diodes in the other array, respectively, so that an electrically stable operation can be obtained.

Meanwhile, in each of the light emitting cells, a codoped layer may be interposed between the lower semiconductor layer of a first conductive type and the lower active layer or between the semiconductor layer of a second conductive type and the upper active layer.

Advantageous Effects

According to the embodiments of the present invention, there is provided a light emitting diode capable of improving light output per unit area using vertically stacked light emitting diodes. Further, there is provided a light emitting device which emits light with a plurality of wavelengths by forming active layers of the vertically stacked light emitting diodes with different materials. Furthermore, there is provided a light emitting device with improved light output which can be driven under an AC power supply by electrically connecting a plurality of light emitting cells having vertically stacked light emitting diodes.

BRIEF DESCRIPTION OF THE DRAWINGS

FIGS. 4 (*a*) to (*c*) are sectional views illustrating a method of manufacturing the light emitting device of FIG. 3.

BEST MODE FOR CARRYING OUT THE INVENTION

Hereinafter, preferred embodiments of the present invention will be described in detail with reference to the accompanying drawings. The following embodiments are provided as an illustration to fully convey the spirit of the present invention to those skilled in the art. Thus, the present invention is not limited to the embodiments which will be described below, but may be implemented in other forms. In the drawings, the width, length, thickness, etc. of components may be exaggerated for the sake of convenience. Throughout the descriptions, like reference numerals designate like elements.

Figure 1:
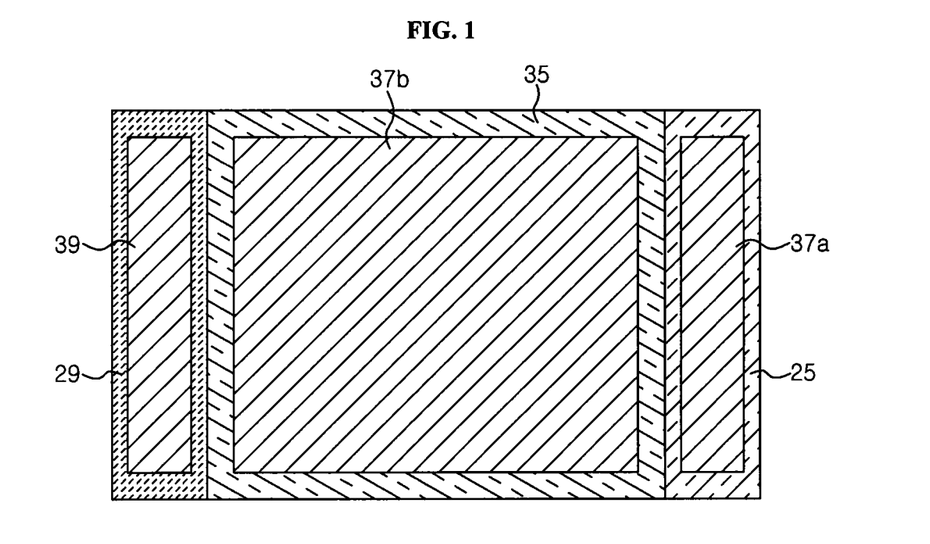
FIGS. 1 and 2 are plan and sectional views illustrating an embodiment of a light emitting device according to an aspect of the present invention, respectively.
Figure 2:
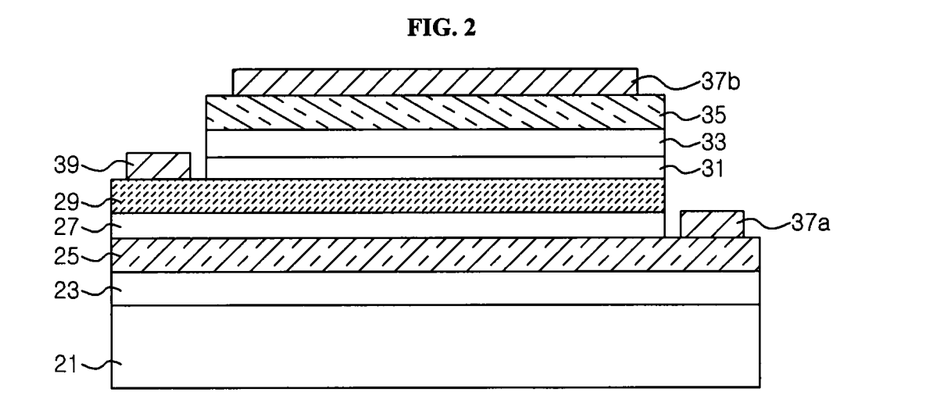

FIGS. 1 and 2 are plan and sectional views illustrating an embodiment of a light emitting device according to an aspect of the present invention, respectively.

Referring to FIGS. 1 and 2, a lower N-type semiconductor layer 25 is positioned on a substrate 21. For example, the substrate 21 may be a sapphire substrate, SiC substrate or the like. A buffer layer 23 may be interposed between the substrate 21 and the lower N-type semiconductor layer 25. A variety of materials such as GaN, AN, GaInN, AlGaInN and SiN may be used as the buffer layer 23. The buffer layer 23 functions to relieve stress between the substrate 21 and the lower N-type semiconductor layer 25.

A P-type semiconductor layer 29 is positioned on one region of the lower N-type semiconductor layer 25, and a lower active layer 27 is interposed between the lower N-type semiconductor layer 25 and the P-type semiconductor layer 29. Further, an upper N-type semiconductor layer 35 is positioned on one region of the P-type semiconductor layer 29, and an upper active layer 33 is interposed between the P-type semiconductor layer 29 and the upper N-type semiconductor layer 35. As a result, there is provided a light emitting device having the structure in which a lower light emitting diode comprising the lower N-type semiconductor layer 25, the lower active layer 27 and the P-type semiconductor layer 29, and an upper light emitting diode comprising the P-type semiconductor layer 29, the upper active layer 33 and the upper N-type semiconductor layer 35 are stacked one above another.

Each of the lower and upper active layers 27 and 33 may be a single or multiple quantum well. Each of the lower N-type semiconductor layer 25 and the P-type semiconductor layer 29 has a band gap wider than the lower active layer 27, and each of the P-type semiconductor layer 29 and the upper N-type semiconductor layer 35 has a band gap wider than the upper active layer 33.

Each of the lower and upper N-type semiconductor layers 25 and 35, the lower and upper active layers 27 and 33, and the P-type semiconductor layer may be a GaN-based semiconductor layer made of (B, Al, Ga, In)N. Each of the N-type semiconductor layers 25 and 35 may doped with Si, and the P-type semiconductor layer 29 may be doped with Mg.

Meanwhile, in a case where the P-type semiconductor layer 29 is a GaN-based semiconductor layer doped with Mg, the Mg may deteriorate the crystal quality of the upper active layer 33. To avoid the influence of Mg, a codoped layer 31 may be interposed between the P-type semiconductor layer 29 and the upper active layer 33. For example, the codoped layer may be a GaN-based semiconductor layer doped simultaneously with Mg and Si, or with Mg and In. Details for improving the crystal quality of the upper active layer 33 using the codoped layer 31 has been disclosed in IEEE Transactions on Electron Devices, Vol. 49, No. 8, pp. 1361-1366, August 2002, entitled "InGaN/GaN Light Emitting Diodes with a p-Down Structure" by Su et al. According to the document of Su at al., the codoped layer 31 is inserted between the P-type semiconductor layer 29 and the upper active layer 33 such that the crystal quality of the upper active layer 33 can be improved.

Furthermore, a lower N-type electrode 37a is formed on other region of the lower N-type semiconductor layer 25, and an upper N-type electrode 37b is formed on the upper N-type semiconductor layer 35. In addition, a P-type electrode 39 is formed on other region of the P-type semiconductor layer 29. Although the lower N-type electrode 37a and the P-type electrode 39 may be respectively positioned outside of both sides of the upper N-type semiconductor layer 35 as shown in FIG. 1, the present invention is not limited thereto, and the electrodes may be positioned in various ways. Further, to reduce contact resistance with the N-type semiconductor layer 35, the upper N-type electrode 37b may be formed over a wide region on the upper N-type semiconductor layer 35 as shown in this figure. Preferably, the upper N-type electrode 37b is formed as a transparent electrode through which light emitted from the lower and upper active layers 27 and 33 can be transmitted, and may be, for example, made of Indium Tin Oxide (ITO). The N-type lower electrode 37a may also be made of ITO. ITO is brought into ohmic contact with an N-type semiconductor layer to reduce contact resistance therewith. In the meantime, the P-type electrode 39 may be, for example, made of Ni/Au. The electrodes 37a, 37b and 39 may be formed using a lift-off process.

The P-type electrode 39 is connected to one terminal of an external power supply (not shown) and the lower and upper N-type electrodes 37a and 37b are connected to the other terminal of the external power supply such that the light emitting device can be driven. At this time, the P-type electrode 39 is connected to a positive terminal of the external power supply and the N-type electrodes 37a and 37b are connected to a negative terminal of the external power supply. The electrodes may be electrically connected to the external power supply through bonding wires (not shown). Accordingly, a current flows from the P-type electrode 39 to the lower and upper N-type electrode 37a and 37b. That is, forward currents flow through the lower and upper light emitting diodes, so that the lower and upper light emitting diodes are driven.

According to this embodiment, since there is provided a light emitting device having the structure in which lower and upper light emitting diodes are vertically stacked, it can increase the light output per unit area of a substrate as compared with a conventional light emitting device having a single light emitting diode structure.

In this embodiment of the present invention, it has been described that the N-type electrodes 37a and 37b are connected to the negative terminal of the same external power supply. In order to control bias voltages of the upper and lower light emitting diodes to be different from each other, however, different resistor elements may be interposed between the N-type electrodes 37a and 37b and the negative terminal of the external power supply, or the N-type electrodes 37a and 37b may be connected to different external power supplies, respectively.

The light emitting device according to an aspect of the present invention may be modified in various ways. Hereinafter, a variety of modified examples applicable to the embodiments of the present invention will be described with reference to FIGS. 3 to 7. First, FIG. 3 is a sectional view illustrating a first modified example of the light emitting device according to an aspect of the present invention.

Figure 3:
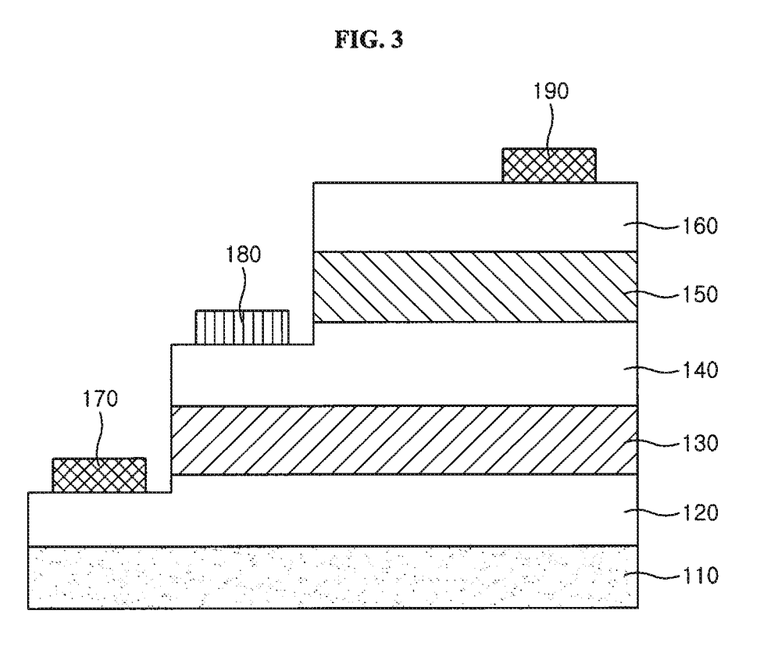
FIG. 3 is a sectional view illustrating a modified example of the light emitting device according to an aspect of the present invention.

Referring to FIG. 3, the light emitting device comprises a lower N-type semiconductor layer 120, a lower active layer 130, a P-type semiconductor layer 140, an upper active layer 150 and an upper N-type semiconductor layer 160, which are stacked on a substrate 110. The semiconductor layers 120, 140 and 160 serve as contact layers of the light emitting device, and are hereinafter referred to as "contact layers." According to this modified example, a lower N-type electrode 170 and a P-type electrode 180 may be positioned in various ways. Here, the electrodes are positioned at the same side of the light emitting device.

A predetermined region of the lower N-type contact layer 120 is exposed through an etching process, and the lower N-type electrode 170 is formed on the exposed lower N-type contact layer 120. Further, a predetermined region of the P-type contact layer 140 is exposed through an etching process, and the P-type electrode 180 is formed on the exposed P-type contact layer 140. An upper N-type electrode 190 is formed on the upper N-type contact layer 160.

The lower and upper active layers 130 and 150 may be formed as different material layers such that light with different wavelengths can be emitted. Accordingly, the light emitting device can emit light with different wavelengths. On the other hand, the lower and upper active layers 130 and 150 may be formed as the same material layer such that light with the same wavelength can be emitted.

Figure 4:
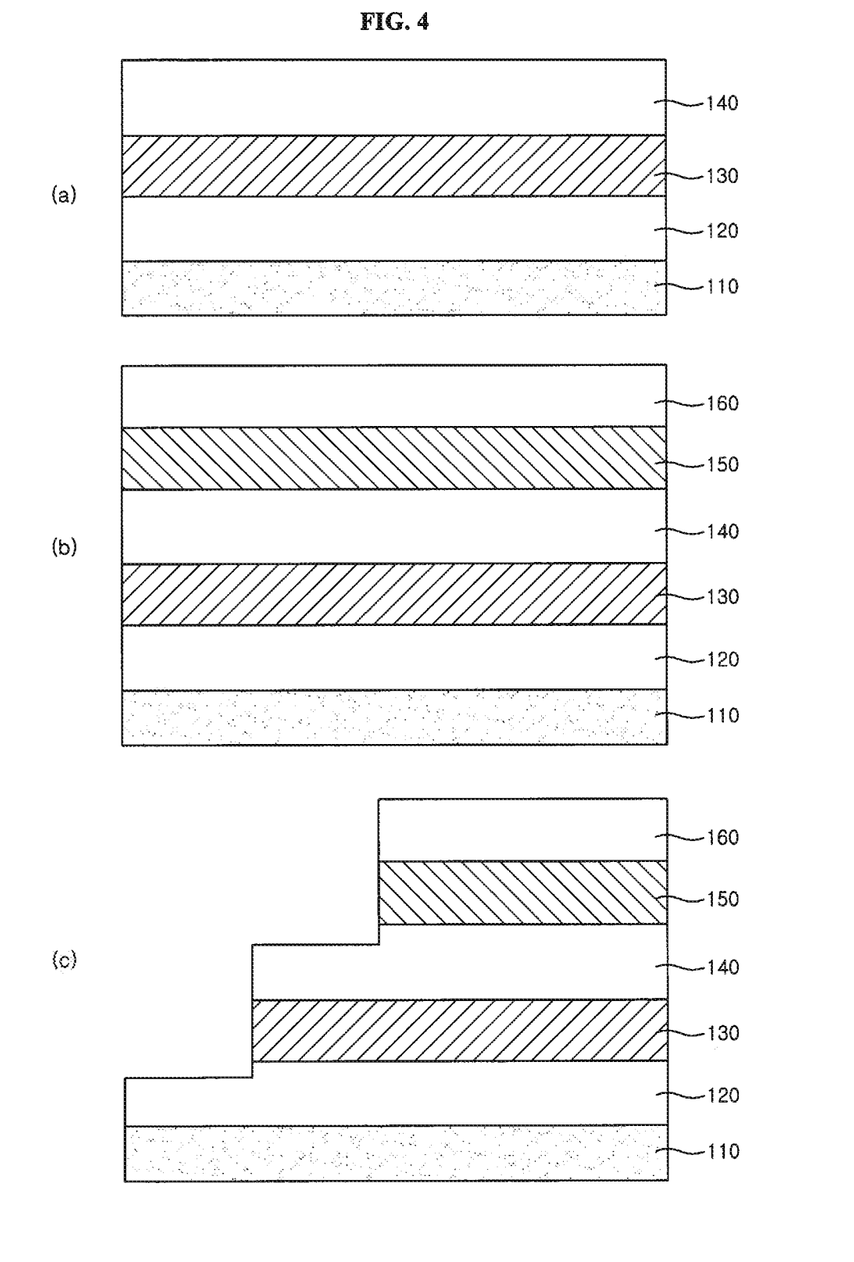

FIG. 4 (a) to (c) are sectional views illustrating a method of manufacturing the light emitting device of FIG. 3 according to the first modified example of the present invention.

Referring to FIG. 4 (a), a substrate 110 is first prepared. The substrate may be formed of a variety of materials such as Si, SiC and sapphire. An N-type lower contact layer 120, a lower active layer 130 and a P-type contact layer 140 are formed on the substrate 110. Si, Ge, Sn, Te, S or the like may be used as an N-type dopant, and Zn, Cd, Be, Mg, Ca, Sr, Ba or the like may be used as a P-type dopant. However, the present invention is not limited thereto.

Referring to FIG. 4 (b), an upper active layer 150 and an upper N-type contact layer 160 are formed on the substrate on which the lower N-type contact layer 120, the lower active layer 130 and the P-type contact layer 140 have been already formed.

Referring to FIG. 4 (c), a predetermined region of the lower N-type contact layer 120 is exposed through an etching process, and a predetermined region of the P-type contact layer 140 is exposed through an etching process.

Then, an N-type electrode 170 is formed on the exposed lower N-type contact layer 120, a P-type electrode 180 is formed on the exposed P-type contact layer 140, and an N-type electrode 190 is formed on the upper N-type contact layer 160, so that the light emitting device of FIG. 3 can be completed.

The materials of the lower and upper active layers can be selected according to a required central light emitting wavelength. Light emitted from a light emitting diode may be divided into infrared light, visible light and ultraviolet light according to the central light emitting wavelength. Such light is determined by a band gap of a material used in active layers. For example, the active layer may be formed of GaAs in the case of infrared light, AlGaAs in the case of red light, GaAsP in the case of yellow to red light, GaP in the case of green to red light, AlInGaP in the case of yellowish green to red light, (Al, In, Ga)N in the case of green, blue, purple, white and ultraviolet light, or the like. In addition, a variety of compound semiconductors may be employed. Further, materials suitable for the lower N-type semiconductor layer, the P-type semiconductor layer and the upper N-type semiconductor layer may be selected depending on materials of the lower and upper active layers 130 and 150.

Meanwhile, if the materials of the lower and upper active layers 130 and 150 are selected to be different from each other, mixed light can be obtained through the combination thereof.

Figure 5:
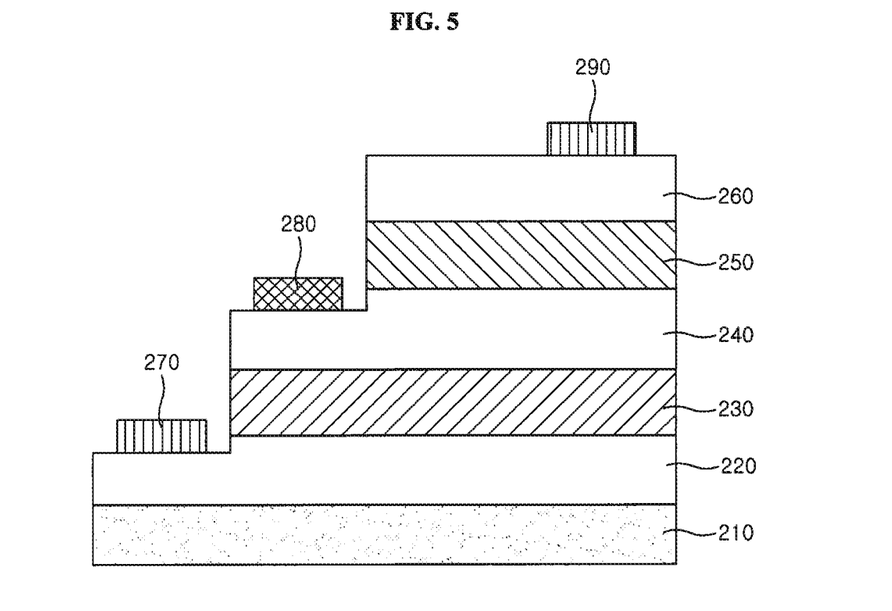
FIGS. 5 to 7 are sectional views illustrating other modified examples of the light emitting device according to an aspect of the present invention.

FIG. 5 is a sectional view illustrating a light emitting device according to a second modified example of the present invention. Here, the second modified example is the same as the first modified example, except in that only the dispositions of contact layers and electrodes formed on the contact layers are different from those of the first modified example. That is, the light emitting device of this modified example is configured in such a manner that a lower P-type contact layer 220, a lower active layer 230, an N-type contact layer 240, an upper active layer 250 and an upper P-type contact layer 260 are sequentially stacked on a substrate 210.

A predetermined region of the lower P-type contact layer 220 is exposed through an etching process, and a lower P-type electrode 270 is formed on the exposed lower P-type contact layer 220. Further, a predetermined of the N-type contact layer 240 is exposed through an etching process, an N-type electrode 280 is formed on the exposed N-type contact layer 240, and an upper P-type electrode 290 is formed on the upper P-type contact layer 260.

Figure 6:
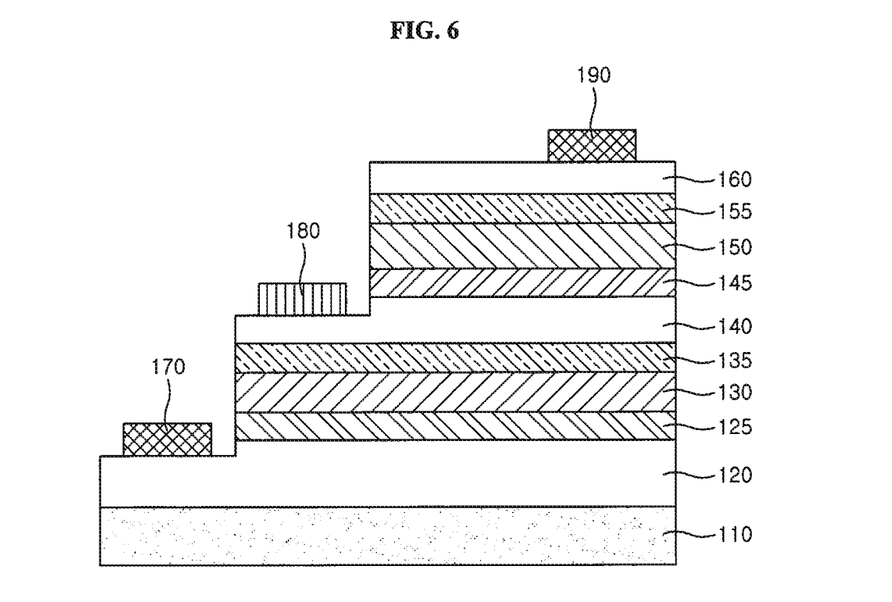

FIG. 6 is a sectional view illustrating a light emitting device according to a third modified example of the present invention. The third modified example is the same as the first modified example, except in that first cladding layers are further formed on top and bottom of a lower active layer and second cladding layers are further formed on top and bottom of a lower active layer.

The light emitting device according to this modified example is configured in such a manner that a lower N-type contact layer 120, a first N-type cladding layer 125, a lower active layer 130, a first P-type cladding layer 135, a P-type contact layer 140, a second P-type cladding layer 145, an upper active layer 150, a second N-type cladding layer 155 and an upper N-type contact layer 160 are sequentially stacked on a substrate 110.

A predetermined region of the lower N-type contact layer 120 is exposed through an etching process, and a lower N-type electrode 170 is formed on the exposed lower N-type contact layer 120. Further, a predetermined region of the P-type contact layer 140 is exposed through an etching process, a P-type electrode 180 is formed on the exposed P-type contact layer 140, and an upper N-type electrode 190 is formed on the upper N-type contact layer 160.

As described above, the first cladding layers 125 and 135 and the second cladding layers 145 and 155 are arranged such that the lower and upper active layers 130 and 150 can be interposed between the first cladding layers and between the second cladding layers, respectively. Therefore, electrons and holes can be efficiently confined within the active layers, and thus, recombination efficiency of electrons and holes can also be enhanced.

Figure 7:
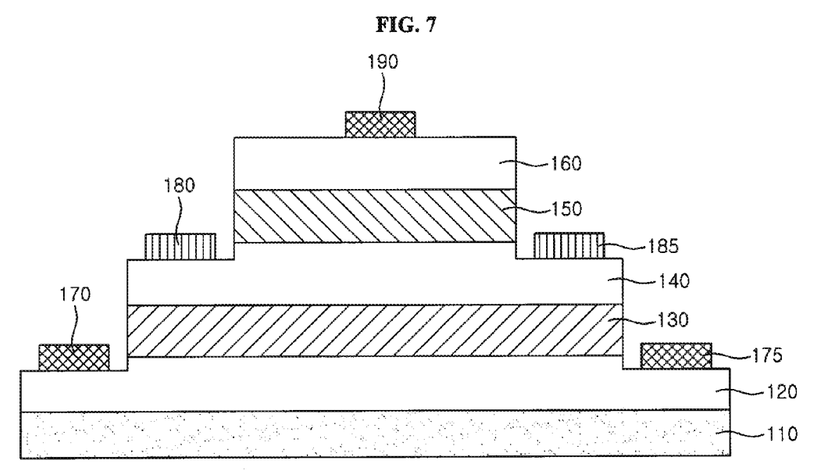

FIG. 7 is a sectional view illustrating a light emitting device according to a fourth modified example of the present invention. The fourth modified example is the same as the first modified example, except in that two electrodes are formed on each contact layer.

That is, the light emitting device of this modified example is formed in such a manner that a lower N-type contact layer 120, a lower active layer 130, a P-type contact layer 140, an upper active layer 150 and an upper N-type contact layer 160 are stacked on a substrate 110.

Predetermined regions of the lower N-type contact layer 120 are exposed through an etching process, and two lower N-type electrodes 170 and 175 are formed on the exposed lower N-type contact layer 120. Further, predetermined regions of the P-type contact layer 140 are exposed through an etching process, two P-type electrodes 180 and 185 are formed on the exposed P-type contact layer 140 and an upper N-type electrode 190 is also formed on the upper N-type contact layer 160. According to such an electrode structure, the amplitude of voltage applied to each of the active layers can be adjusted in various ways.

Although a light emitting device in which two light emitting diodes are stacked vertically to each other has been described in the embodiments and various modified examples of the present invention, the present invention is not limited thereto. That is, at least three or more light emitting diodes may be vertically stacked one above another.

Figure 8:
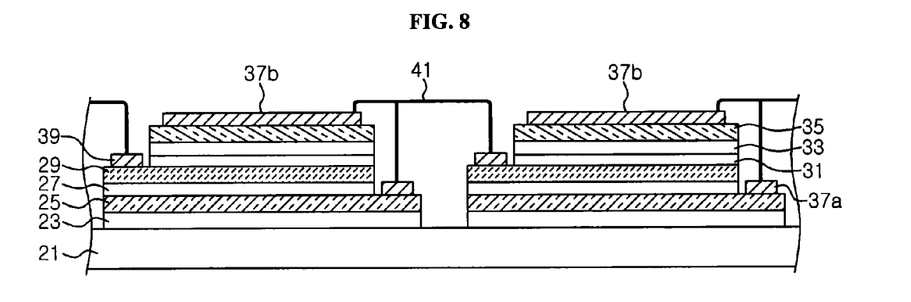
FIGS. 8 and 9 are a partial sectional view and a circuit diagram illustrating an embodiment of a light emitting device having a plurality of light emitting cells according to an aspect of the present invention, respectively.
Figure 9:
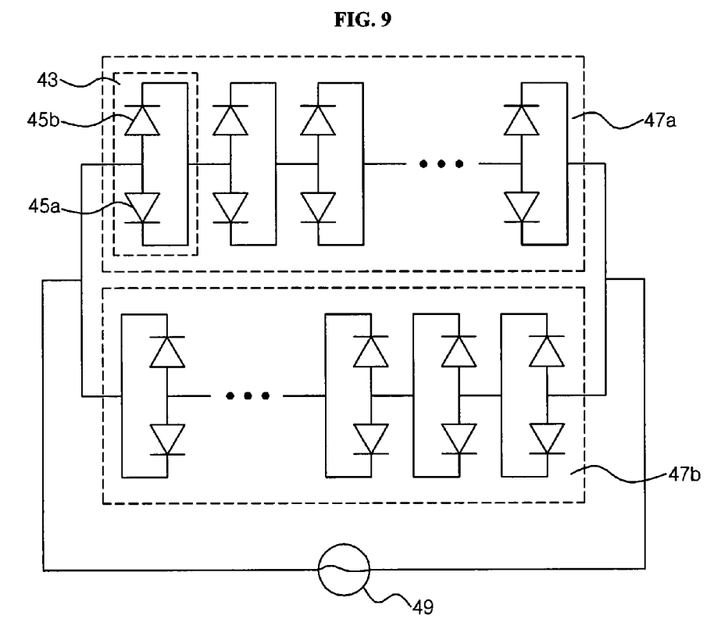

FIGS. 8 and 9 are a partial sectional view and a circuit diagram illustrating an embodiment of a light emitting device having a plurality of light emitting cells according to an aspect of the present invention, respectively.

Referring to FIG. 8, a plurality of light emitting cells are positioned on a single substrate. Here, each of the light emitting cells has a structure in which light emitting diodes are vertically stacked as described with reference to FIGS. 1 and 2. Further, each of the light emitting cells includes a lower N-type electrode 37a, an upper N-type electrode 37b and a P-type electrode 39 as described with reference to FIGS. 1 and 2. Each of the light emitting cells has the same structure as the light emitting device of FIGS. 1 and 2, and may also be modified in various ways as described in FIGS. 3 to 7. Accordingly, detailed descriptions of the structure of the light emitting cell will be omitted herein, and the electrical connections between the light emitting cells will be described.

The lower and upper N-type electrodes 37a and 37b of each of the light emitting cells are electrically connected to the P-type electrode 39 of an adjacent light emitting cell. The electrodes are connected to one another through metal wirings 41. The metal wirings 41 may be formed using an air-bridge or step-cover process.

At this time, although the metal wiring 41 for the connection between the lower N-type electrode 37a and the P-type electrode 39 and the metal wiring 41 for the connection between the upper N-type electrode 37b and the P-type electrode 39 may be connected to each other, the present invention is not limited thereto. For example, the metal wirings may be separated from each other.

Referring to FIG. 9, there are provided arrays 47a and 47b in which light emitting cells 43 each having lower and upper light emitting diodes 45a and 45b are connected in series with each other, by means of the connection of the metal wirings 41 as describe with respect to FIG. 8. The serial arrays 47a and 47b are connected in reverse parallel to an AC power supply 49. Accordingly, a light emitting device which can be driven under an AC power supply can also be obtained.

According to this embodiment of the present invention, light emitting cells each having the vertically stacked light emitting diodes 45a and 45b are employed such that light output per area of a single chip in a light emitting device operating under an AC power supply can be increased.

Figure 10:
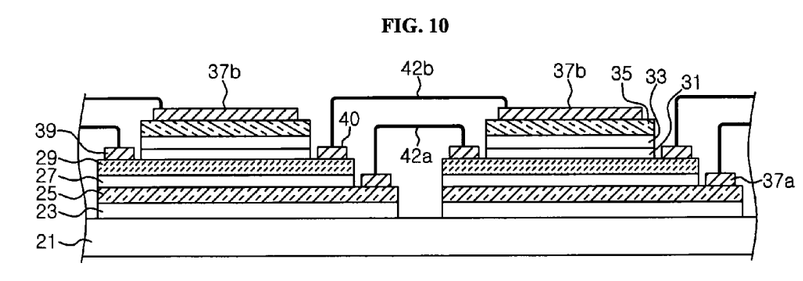
FIGS. 10 and 11 are a partial sectional view and a circuit diagram illustrating another embodiment of a light emitting device having a plurality of light emitting cells according to an aspect of the present invention, respectively.

The number, arrangement and connection structure of electrodes which are formed on the lower and upper N-type semiconductor layers 25 and 35 and the P-type semiconductor layer 29 may be selected in various ways. FIGS. 10 and 12 are views illustrating an embodiment in which the number and connection structure of electrodes are different from those in the previous embodiments. Here, FIGS. 10 and 11 are a partial sectional view and a circuit diagram illustrating the embodiment of the light emitting device having a plurality of light emitting cells according to an aspect of the present invention, respectively, and FIG. 12 is an equivalent circuit diagram of FIG. 11.

Referring to FIG. 10, a plurality of light emitting cells are positioned on a single substrate. Here, each of the light emitting cells has a structure in which light emitting diodes are vertically stacked as described with reference to FIGS. 1 and 2. Further, each of the light emitting cells includes a lower N-type electrode 37a, an upper N-type electrode 37b and a P-type electrode 39 as described with reference to FIGS. 1 and 2. Here, each of the light emitting cells is almost the same as the light emitting device of FIGS. 1 and 2, but it is different from the light emitting device in that other P-type electrode 40 is further formed on another region of the P-type semiconductor layer 29. Although the another region may be selected to be opposite to the other region in a state where the active layer 33 is interposed between the regions as shown in the figure, the present invention is not limited thereto.

Meanwhile, the lower N-type electrode 37a of each of the light emitting cells is electrically connected to the P-type electrode 39 of an adjacent light emitting cell, the other P-type electrode 40 of each of the light emitting cells is electrically connected to the upper N-type electrode 37b of the adjacent light emitting cell, the P-type electrode 39 of each of the light emitting cells is electrically connected to the lower N-type electrode 37a of other adjacent light emitting cell, and the upper N-type electrode 37b of each of the light emitting cells is electrically connected to the other P-type electrode 40 of the other adjacent light emitting cell. The lower N-type electrode 37a is connected to the P-type electrode 39 of the adjacent light emitting cell through a metal wiring 42a, and the upper N-type electrode 37b is connected to the other P-type electrode 40 of the adjacent light emitting cell through a metal wiring 42b. The metal wirings 42a and 42b may be formed using an air-bridge or step-cover process.

Figure 11:
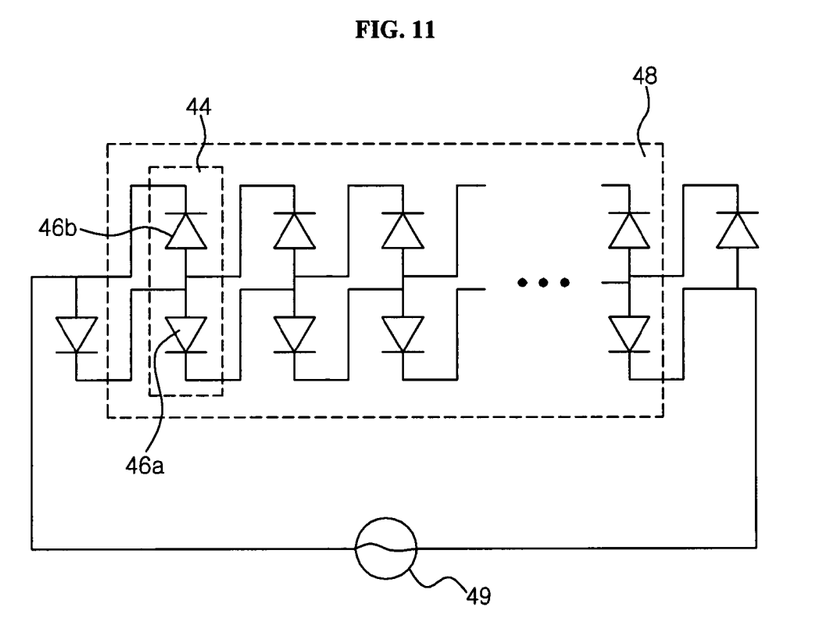
Figure 12:
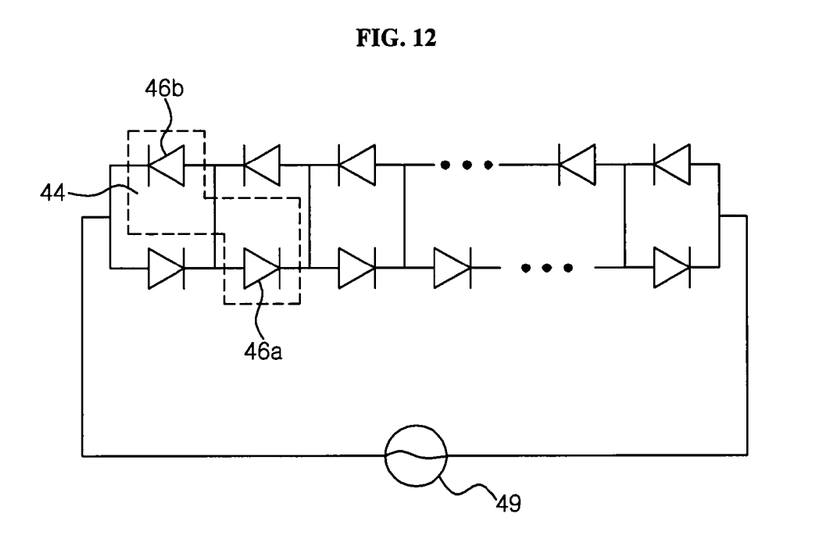
FIG. 12 is an equivalent circuit diagram of FIG. 11.

Referring to FIG. 11, through the connections by the metal wirings 42a and 42b as described with reference to FIG. 10, there is provided an array 48 in which light emitting cells 44 each having lower and upper light emitting diodes 46a and 46b are connected to one another. At this time, the lower light emitting diodes 46a are connected in series to each other, and the upper light emitting diodes 46b are also connected in series to one another. An array with the lower light emitting diodes 46a connected in series and an array with the upper light emitting diodes 46b connected in series are arranged in reverse parallel to each other.

Meanwhile, additional diodes may be connected to both sides of the array 48 of the light emitting cells 44 as shown in this figure, so that an equivalent circuit shown in FIG. 12 can be configured.

Referring to FIG. 12, the lower light emitting diodes 46a and an additional light emitting diode are connected in series to form one serial array, and the upper light emitting diodes 46b and an additional light emitting diode are connected in series to form another serial array. The arrays of the lower and upper light emitting diodes 46a and 46b are connected in reverse parallel to each other. Thus, an AC power supply 49 is connected to both ends of the arrays such that the light emitting cells can be driven. As the phase of the AC power supply 49 is shifted, the arrays of the upper and lower light emitting diodes 46b and 46a are alternately operated.

Meanwhile, nodes between the lower light emitting diodes 46a are electrically connected to nodes between the upper light emitting diodes 46b, respectively, as shown in FIG. 12. Through the electrical connection between the nodes, the light emitting cells 44 can be stably driven under the AC power supply, and thus, the reliability of the light emitting device can be enhanced.

Although a circuit in which the additional light emitting diodes are connected to the array 48 of the light emitting cells 44 is illustrated in this embodiment, it is only for convenience of illustration. The additional light emitting diodes may be omitted herein.

Figure 13:
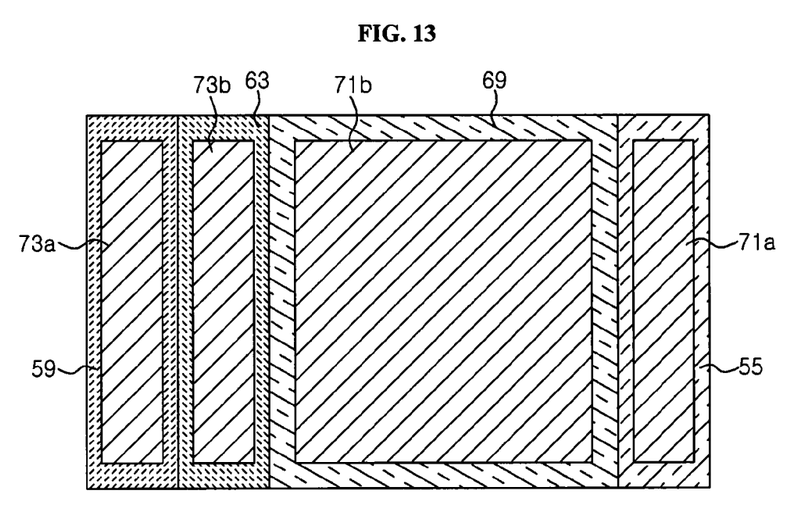
FIGS. 13 and 14 are plan and sectional views illustrating an embodiment of a light emitting device according to another aspect of the present invention, respectively.
Figure 14:
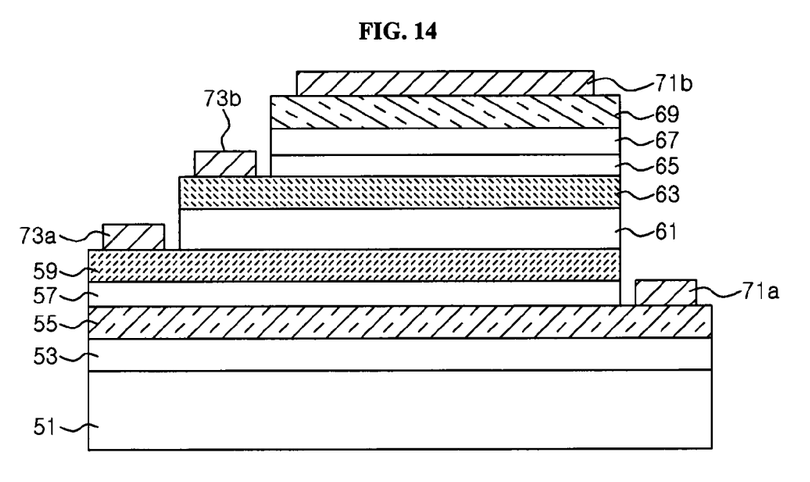

FIGS. 13 and 14 are plan and sectional views illustrating a light emitting device according to another embodiment of the present invention, respectively.

Referring to FIGS. 13 and 14, a lower N-type semiconductor layer 55 is positioned on a substrate 51, and a buffer layer 53 may be interposed between the substrate 51 and the lower N-type semiconductor layer 55, as described with reference to FIGS. 1 and 2.

A P-type lower semiconductor layer 59 is positioned on one region of the lower N-type semiconductor layer 55, and a lower active layer 57 is interposed between the lower N-type semiconductor layer 55 and the lower P-type semiconductor layer 59. Further, an upper P-type semiconductor layer 63 is positioned on one region of the lower P-type semiconductor layer 59, and a separating layer 61 is interposed between the lower P-type semiconductor layer 59 and the upper P-type semiconductor layer 63. In addition, an upper N-type semiconductor layer 69 is positioned on one region of the upper P-type semiconductor layer 63, and an upper active layer 67 is interposed between the upper P-type semiconductor layer 63 and the upper N-type semiconductor layer 69. As a result, there is provided a light emitting device having the structure in which a lower light emitting diode comprising the lower N-type semiconductor layer 55, the lower active layer 57 and the lower P-type semiconductor layer 59, and an upper light emitting diode comprising the upper P-type semiconductor layer 63, the upper active layer 67 and the upper N-type semiconductor layer 69 are stacked.

Each of the lower and upper active layers 57 and 67 may be a single or multiple quantum well. Each of the N-type lower semiconductor layer 55 and the lower P-type semiconductor layer 59 has a band gap wider than the lower active layer 57, and each of the upper P-type semiconductor layer 63 and the upper N-type semiconductor layer 69 has a band gap wider than the upper active layer 67.

Each of the lower and upper N-type semiconductor layers 55 and 69, the lower and upper active layers 57 and 67, and the lower and upper P-type semiconductor layers may be a GaN-based semiconductor layers made of (B, Al, Ga, In)N. Each of the N-type semiconductor layers 55 and 59 may doped with Si, and the P-type semiconductor layers 59 and 63 may be doped with Mg.

Meanwhile, the separating layer 61 is employed to electrically separate the lower and upper light emitting diodes, and may be an insulating or high-resistance semi-insulating layer. Preferably, the separating layer 61 is made of a material having a crystal structure identical or similar to that of the lower and upper P-type semiconductor layers 59 and 63. For example, the separating layer may be formed of a semi-insulating GaN.

Further, a codoped layer 65 may be interposed between the upper P-type semiconductor layer 63 and the upper active layer 67, as illustrated with reference to FIG. 2. In a case where the P-type semiconductor layer 63 is made of GaN doped with Mg, the codoped layer 65 is employed to improve the crystal quality of the upper active layer 67.

Furthermore, a lower N-type electrode 71a is formed on other region of the lower N-type semiconductor layer 55, and an upper N-type electrode 71b is formed on the upper N-type semiconductor layer 69. In addition, a lower P-type electrode 73a is formed on other region of the lower P-type semiconductor layer 59, and an upper P-type electrode 73b is formed on other region of the upper P-type semiconductor layer 63. For example, the lower and upper N-type electrodes 71a and 71b may be made of ITO, and the lower and upper P-type electrodes 73a and 73b may be made of Ni/Au. These electrodes 71a, 71b, 73a and 73b may be formed using a lift-off process.

The P-type electrodes 73a and 73b are connected to one terminal of an external power supply (not shown) and the N-type electrodes 71a and 71b are connected to the other terminal of the external power supply, so that the light emitting device can be driven. The electrodes may be electrically connected to the external power supply through bonding wires (not shown). Accordingly, currents flow from the lower P-type electrode 73a to the lower N-type electrode 71a and from the upper P-type electrode 73b to the upper N-type electrode 71b such that the lower and upper light emitting diodes can be driven. Further, the lower P-type and N-type electrodes 73a and 71a, and the upper P-type and N-type electrodes 73b and 71b are connected to different external power supplies, respectively, so that the lower and upper light emitting diodes can be individually driven.

According to this embodiment, since there is a light emitting device having the structure in which the lower and upper light emitting diodes are vertically stacked, light output per unit area of a substrate can be increased as compared with a conventional light emitting device configured with a single light emitting diode. Further, since the upper and lower light emitting diodes are electrically separated from each other by employing the separating layer 61, the light emitting diodes can be individually driven.

Figure 15:
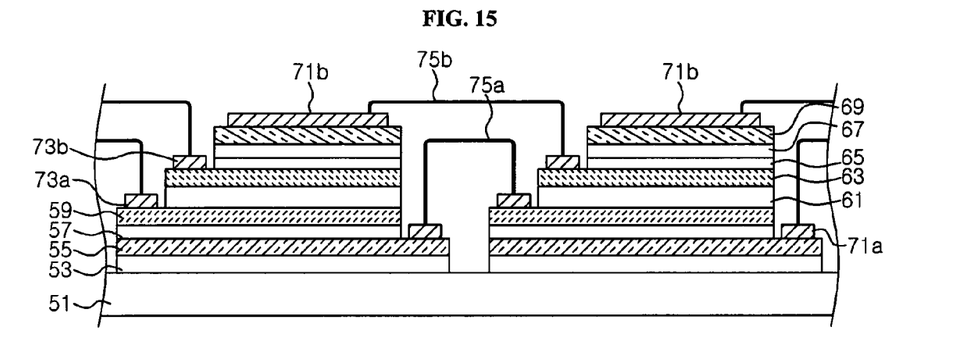
FIGS. 15 and 16 are a partial sectional view and a circuit diagram illustrating an embodiment of a light emitting device having a plurality of light emitting cells according to another aspect of the present invention, respectively.
Figure 16:
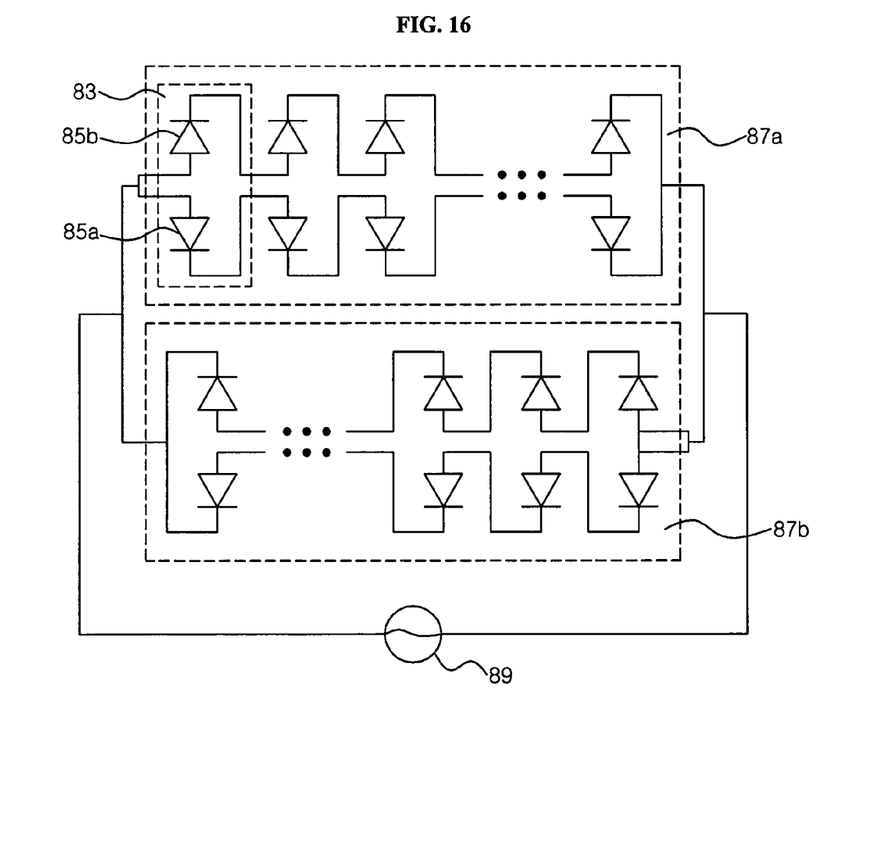

FIGS. 15 and 16 are a partial sectional view and a circuit diagram illustrating a light emitting device having a plurality of light emitting cells according to another embodiment the present invention, respectively.

Referring to FIG. 15, a plurality of light emitting cells are positioned on a single substrate. Here, each of the light emitting cells has a structure of vertically stacked light emitting diodes, as described with reference to FIGS. 13 and 14. Further, each of the light emitting cells has a lower N-type electrode 71a, an upper N-type electrode 71b, a lower P-type electrode 73a and an upper P-type electrode 73b, as described with reference to FIGS. 13 and 14. Here, since the structure of the light emitting cell is the same as that of the light emitting device described with reference to FIGS. 13 and 14, detailed descriptions on the structure thereof will be omitted herein, and only the electrical connection between the light emitting cells will be described.

The lower and upper N-type electrodes 71a and 71b of one light emitting cell are electrically connected to the lower and upper P-type electrode 73a and 73b of an adjacent light emitting cell, respectively. The lower N-type and P-type electrodes 71a and 73a may be connected to each other through a metal wiring 75a, and the upper N-type and P-type electrodes 71b and 73b may be connected to each other through a metal wiring 75b. The metal wirings 75a and 75b may be formed together using an air-bridge or step-cover process.

Although the metal wirings 75a and 75b may be formed to be separated from each other as shown in the figure, the present invention is not limited thereto but the wirings may be connected to each other.

Referring to FIG. 16, through the connections by the metal wirings 75a and 75b as described with reference to FIG. 15, there are provided arrays 87a and 87b in which light emitting cells 83 each having lower and upper light emitting diodes 85a and 85b are connected in series to each other. The serial arrays 87a and 87b are connected in reverse parallel to an AC power supply 89. Accordingly, there is provided a light emitting device which can be driven by an AC power supply.

Meanwhile, in a case where the metal wirings 75a and 75b are formed to be separated from each other, the lower light emitting diodes 85a are also connected in series to form an array, and the upper light emitting diodes 85b are also formed into an array. Thus, the serial arrays of upper and lower light emitting diodes are connected in reverse parallel, so that there can be provided a light emitting device in which the lower and upper light emitting diodes of each light emitting cell are alternately driven under an AC power supply. As a result, there can be a light emitting device in which light is emitted throughout the entire region of a chip under an AC power supply.

A light emitting device according to the embodiments of the present invention can be mounted to a light emitting diode package in various forms. For example, the light emitting device may be mounted with the substrate 21 of the light emitting device served as a mounting surface. On the contrary, the light emitting device may be mounted to a submount substrate through a flip-chip bonding process. In a case where the light emitting device is flip-chip bonded on the substrate, the upper N-type semiconductor layer(s) 35 and/or 69 of the light emitting device is bonded on the submount substrate through metal bump(s). Since the light emitting device is flip-chip bonded on a submount substrate with superior heat radiation characteristics, heat radiated from the light emitting device can be easily removed to thereby further improve light emitting efficiency.

What is claimed is:

1. A light emitting device having vertically stacked light emitting diodes, comprising:
    a substrate;
    a first light emitting diode, comprising;
        a lower semiconductor layer of a first conductive type positioned on the substrate;
        a lower semiconductor layer of a second conductive type positioned on the lower semiconductor layer of the first conductive type;
        a lower active layer interposed between the lower semiconductor layer of the first conductive type and the lower semiconductor layer of the second conductive type;
    a second light emitting diode, comprising:
        an upper semiconductor layer of the second conductive type positioned on the lower semiconductor layer of the second conductive type and comprising a GaN-based P-type semiconductor layer;
        an upper semiconductor layer of the first conductive type positioned on the upper semiconductor layer of the second conductive type; and
        an upper active layer interposed between the upper semiconductor layer of the second conductive type and the upper semiconductor layer of the first conductive type;
    a separating layer
        interposed between the lower semiconductor layer of the second conductive type and the upper semiconductor layer of the second conductive type,
        the separating layer electrically separating the first and second light emitting diodes; and
    a codoped layer interposed between the lower semiconductor layer of the first conductive type and the lower active layer or between the upper semiconductor layer of the second conductive type and the upper active layer.

2. The light emitting device as claimed in claim 1, wherein the separating layer is a semi-insulating layer.

3. The light emitting device of claim 1, wherein the first conductive type comprises N-type conductivity, and the second conductive type comprises P-type conductivity.

4. The light emitting device of claim 3, further comprising a lower N-type electrode positioned on the lower semiconductor layer of the first conductive type, and an upper N-type electrode positioned on the upper semiconductor layer of the first conductive type,
    wherein the lower N-type electrode and the upper N-type electrode comprise indium tin oxide (ITO).

5. The light emitting device of claim 1, wherein the upper semiconductor layer of the second conductive type is doped with Mg.

6. The light emitting device of claim 5, wherein the codoped layer comprises a GaN-based semiconductor layer doped with Mg and Si.

7. The light emitting device of claim 6, wherein the codoped layer is interposed between the upper semiconductor layer of the second conductive type and the upper active layer, and the codoped layer is configured to increase the internal quantum efficiency of the light emitting device.

8. A light emitting device having a plurality of light emitting cells formed on a substrate, wherein each of the light emitting cells comprises:
    a first light emitting diode, comprising;
    a lower semiconductor layer of a first conductive type positioned on the substrate;
    a lower semiconductor layer of a second conductive type positioned on one region of the lower semiconductor layer of the first conductive type; and
    a lower active layer interposed between the lower semiconductor layer of the first conductive type and the lower semiconductor layer of the second conductive type;
    a second light emitting diode, comprising:
    an upper semiconductor layer of the second conductive type positioned on one region of the lower semiconductor layer of the second conductive type and comprising a GaN-based P-type semiconductor layer;
    an upper semiconductor layer of the first conductive type positioned on one region of the upper semiconductor layer of the second conductive type;
    an upper active layer interposed between the upper semiconductor layer of the second conductive type and the upper semiconductor layer of the first conductive type; and
    a separating layer interposed between the lower semiconductor layer of the second conductive type and the upper semiconductor layer of the second conductive type, the separating layer electrically separating the first and second light emitting diodes, wherein each of the light emitting cells further comprises a codoped layer interposed between the lower semiconductor layer of the first conductive type and the lower active layer or between the upper semiconductor layer of the second conductive type and the upper active layer.

9. The light emitting device as claimed in claim 8, wherein the separating layer is a semi-insulating layer.

10. The light emitting device of claim 8, wherein the first conductive type comprises N-type conductivity, and the second conductive type comprises P-type conductivity.

11. The light emitting device of claim 10, wherein each of the light emitting cells further comprises a lower N-type electrode positioned on the lower semiconductor layer of the first conductive type, and an upper N-type electrode positioned on the upper semiconductor layer of the first conductive type,
wherein the lower N-type electrode and the upper N-type electrode comprise indium tin oxide (ITO).

* * * * *